United States Patent [19]

Nagami

[11] 4,322,825
[45] Mar. 30, 1982

[54] FLEXIBLE HIDDEN REFRESH MEMORY CIRCUIT

[75] Inventor: Akira Nagami, Tokyo, Japan

[73] Assignee: Nippon Electric Co., Ltd., Tokyo, Japan

[21] Appl. No.: 137,333

[22] Filed: Apr. 4, 1980

[30] Foreign Application Priority Data

Apr. 4, 1979 [JP] Japan .................................. 54-40671

[51] Int. Cl.$^3$ .............................................. G11C 7/00
[52] U.S. Cl. ..................................... 365/203; 365/233
[58] Field of Search ................................ 365/203, 233

[56] References Cited

U.S. PATENT DOCUMENTS 3,801,964 4/1974 Palfi et al. ............................ 365/203
3,969,706 7/1976 Proebsting et al. .................. 365/203

Primary Examiner—Stuart N. Hecker
Attorney, Agent, or Firm—Sughrue, Mion, Zinn, Macpeak and Seas

[57] ABSTRACT

In a dynamic random access memory including means for inputting a row strobe signal and means for inputting a column strobe signal, and having the functions of incorporating a row address input in response to the row strobe signal and incorporating a column address input in response to the column strobe signal, an improvement comprising a first insulated gate field effect transistor having its drain coupled to a first junction point, its gate receiving the column strobe signal and its source supplied with a first power supply, means for charging the first junction point within a period of active level of the row strobe signal, a second insulated gate field effect transistor having its drain coupled to the first junction point, its gate coupled to a second junction point and its source supplied with the first power supply terminal, means for precharging the second junction point within a period of absence of the row strobe signal, and a third insulated gate field effect transistor having its drain coupled to the second junction point, its gate supplied with the column strobe signal and its source supplied with the first power supply. After completion of a desired operation with respect to a selected memory cell, the row strobe signal is placed at its inactive level to be reset while the column strobe signal is at its active level. Then, after a necessary reset period when the row strobe signal is made active, a change from inactive level to active level of the first junction point is suppressed to thereby inhibit active operation based on the column strobe signal.

5 Claims, 15 Drawing Figures

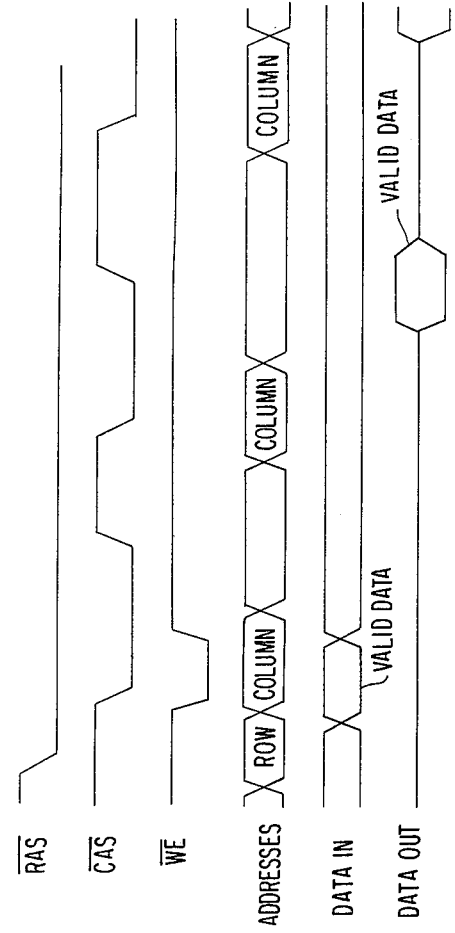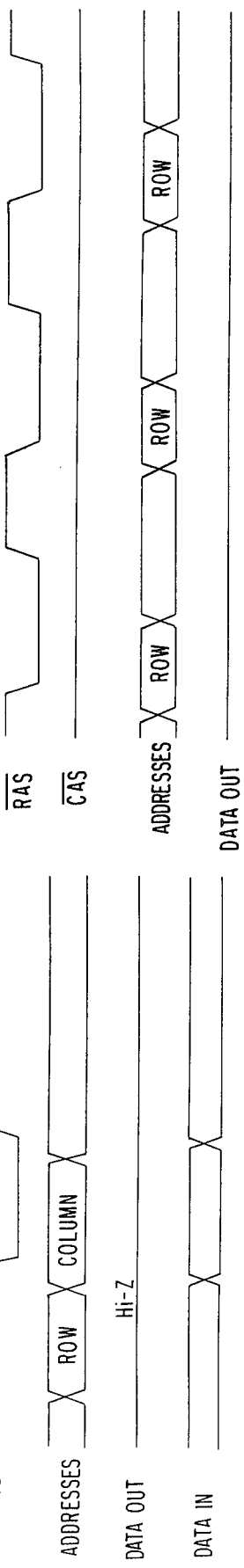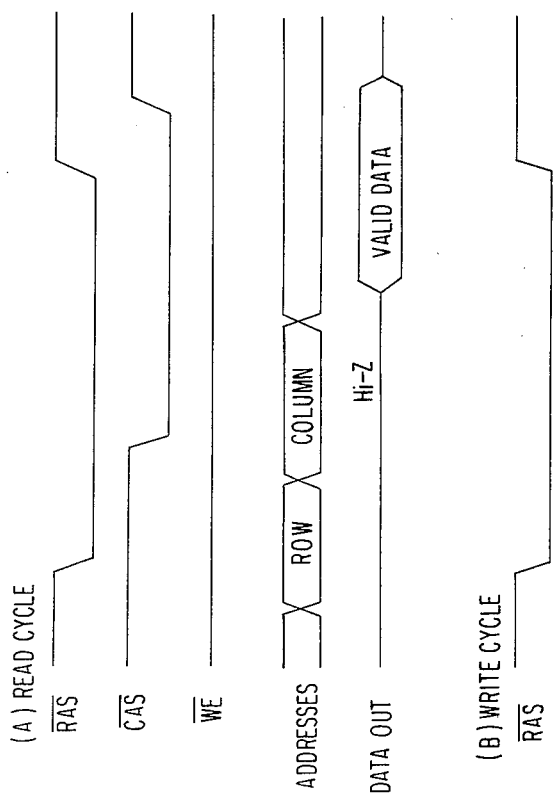

FLEXIBLE HIDDEN REFRESH MEMORY CIRCUIT

BACKGROUND OF THE INVENTION

The present invention relates to a memory circuit constituted of semiconductor elements, and more particularly to a memory circuit employing insulated gate field effect transistors (IGFET's) fabricated on a semiconductor chip.

In dynamic random access memories employing IGFETs (hereinafter abbreviated as dynamic RAM) a 2-clock multi-address system has been employed in a 16 K-bit memory as well as in a 64 K-bit memory both with a 16-pin package structure. The details of this multi-address system are disclosed in the specification and drawings of U.S. Pat. No. 3,969,706 issued to Robert J. Proebsting et al on July 13, 1976. Basically, two input clocks, that is, a row strobe signal defined as ROW ADDRESS STROBE (abbreviated as $\overline{RAS}$) and a column strobe signal defined as COLUMN ADDRESS STROBE (abbreviated as $\overline{CAS}$) are generated in a predetermined sequence. In the following description, an example is adopted where N-channel IGFET's are used and $\overline{RAS}$ and $\overline{CAS}$ are assumed to be active when they are low signals. At first, when $\overline{RAS}$ becomes active by turning it from a high level to a low level, input levels at address terminals at that time point are incorporated in the memory and held therein as row address inputs which are used to select a word line and refresh memory cells connected to the selected word line. After completion of latching of address inputs in response to $\overline{RAS}$, $\overline{CAS}$ becomes active by being turned from a high level to a low level to thereby incorporate the input levels at the address terminals at this time in the memory as column address inputs. Depending upon a level of a write control signal defined as WRITE ENABLE (abbreviated as $\overline{WE}$), if $\overline{WE}$ is not at its active level, i.e., it remains high, then data read-out from the selected memory cell is effected so that the data appear at a data output terminal. If $\overline{WE}$ is at its active level, on the other hand, then the data at a data input terminal at the time point is written in the selected memory cell.

Recently a refresh operation called "HIDDEN REFRESH" has been employed in the multi-address system. This refresh operation is as follows:

After read-out data from a selected memory cell has been obtained by sequentially making $\overline{RAS}$ and $\overline{CAS}$ active the refresh operations for the memory cells on the different word lines can be sequentially effected while maintaing the read-out data at the data output terminal by repeatedly making $\overline{RAS}$ active and maintaining $\overline{CAS}$ at the low level. In other words, during the period when the read-out data is effectively revealed, the refresh operation can be effected simultaneously, and this operation is thus called HIDDEN REFRESH. However, HIDDEN REFRESH must be performed under the condition that $\overline{WE}$ is maintained at the high level i.e. inactive level, and hence this mode of operation lacks flexibility in control.

SUMMARY OF THE INVENTION

It is one object of the present invention to provide a memory circuit having such flexibility that HIDDEN REFRESH may be controlled only by $\overline{RAS}$ and $\overline{CAS}$ irrespective of any other inputs such as $\overline{WE}$.

Another object of the present invention is to provide a practical and useful circuit structure for realizing the aforementioned feature.

According to one aspect of the present invention, there is provided a memory circuit characterized by the following function:

After necessary operations for a selected memory cell have been completed by sequentially making $\overline{RAS}$ and $\overline{CAS}$ active, $\overline{RAS}$ is made inactive while $\overline{CAS}$ is kept active. Then, after a necessary inactive period of $\overline{RAS}$, when $\overline{RAS}$ is again made active, all the the active operations based on active level of $\overline{CAS}$ are inhibited, whereby the state at the time point when the necessary operations were completed can be in itself maintained at the data output terminal.

According to another aspect of the present invention, there is provided a semiconductor integrated circuit for achieving the above-featured memory circuit, which comprises a load element having one end coupled to a first power supply terminal and the other end coupled to a first junction point, a first IGFET having its drain coupled to the first junction point, its gate receiving $\overline{CAS}$ and its source coupled to a second power supply terminal, a second IGFET having its drain coupled to the first junction point, its gate coupled to a second junction point and its source coupled to the second power supply terminal, a third IGFET having its drain coupled to the first power supply terminal, its gate receiving a first clock which takes its active level in response to $\overline{RAS}$ input going into an inactive period and then inactive within the same inactive period, and its source coupled to the second junction point, and a fourth IGFET having its drain coupled to the second junction point, gate receiving $\overline{CAS}$ and its source coupled to the second power supply terminal.

The above-mentioned and other features and objects of the present invention will become more apparent by reference to the following description of its preferred embodiments taken in conjunction with the accompanying drawings.

BRIEF DESCRIPTION OF THE DRAWINGS

FIG. 1 is a timing diagram showing a read cycle and a write cycle of a RAM according to the 2-clock system;

FIG. 2 is a timing diagram representing a known page mode cycle;

FIG. 3 is a timing diagram showing known RAS ONLY REFRESH mode;

DETAILED DESCRIPTION OF THE PREFERRED EMBODIMENT

In the following description, MOS transistors (hereinafter abbreviated as MOST) which are representative ones among IGFETs are employed, and it is further assumed that the MOSTs used herein are N-channel ones wherein a higher level is a logic-1 level, and a lower level is a logic-O level. However, this invention is not limited to the use of MOSTs and N-channel IGFETs.

The operations of the known 2-clock multi-address system will be described in greater detail with reference to FIGS. 1 to 4.

Timing relations between $\overline{RAS}$, $\overline{CAS}$, $\overline{WE}$, data input and address input in a read cycle and in a write cycle are illustrated in FIG. 1(A) and FIG. 1(B) together with a general waveform of the data output. In the read cycle of FIG. 1(A), after a necessary access time has elapsed from a change of $\overline{CAS}$ to a low level, the effective data appear at the data output and are maintained until $\overline{CAS}$ is changed to a high level to be reset. While in the write cycle of FIG. 1(B), according to a general output mode the data output terminal is kept at a high impedance state (Hi-Z) and there appear no data.

A so-called "page mode" will now be described with reference to FIG. 2. In this mode, $\overline{RAS}$ and $\overline{CAS}$ are changed to a low level to be enabled or activated in sequence, and the reset state and enabled state of $\overline{CAS}$ are repeated while maintaining $\overline{RAS}$ at a low level. At a result, with respect to the memory cells on the same word line selected by the operation based on $\overline{RAS}$, write-in or read-out can be achieved in the memory cell at the column address designated by the address input in response to $\overline{CAS}$ only. In other words, if the operation is limited to memory cells on a single word line, it is possible to shorten the cycle time and the access time, and this operation is called "page mode".

Next the operation of "$\overline{RAS}$ only refresh ($\overline{RAS}$ ONLY REFRESH)" will be explained with reference to FIG. 3. $\overline{RAS}$ are repeatedly made a low level and a high level while maintaining $\overline{CAS}$ at a high level, i.e., at its reset state. Then naturally only the circuit portion enabled by $\overline{RAS}$ operates, and the contents of the memory cells on the word line corresponding to the row address designated by the address input are refreshed. This operation is called "$\overline{RAS}$ ONLY REFRESH."

Figure 4:
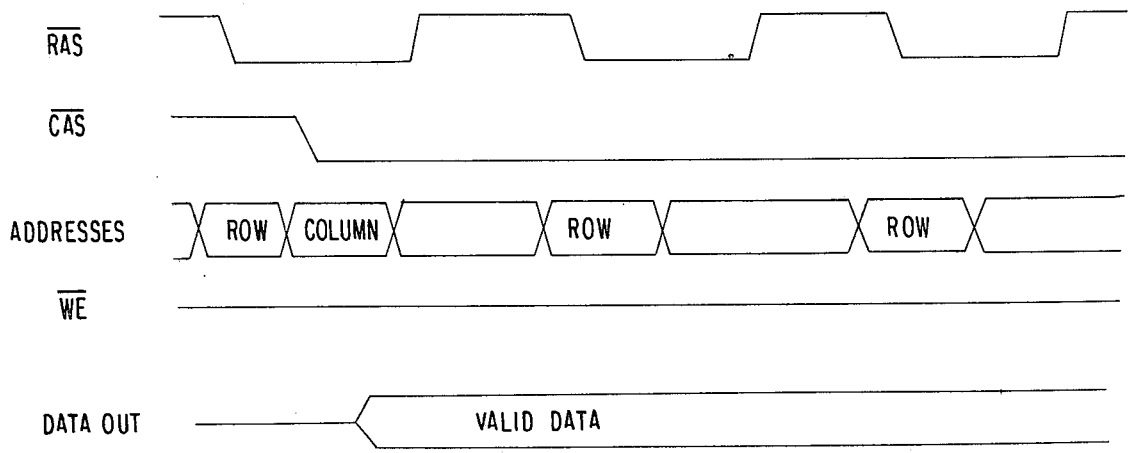
FIG. 4 is a timing diagram showing known HIDDEN REFRESH mode.

In addition to the normal read cycle and write cycle, the page mode operation and the $\overline{RAS}$ ONLY REFRESH operation form the characteristic operation of the $\overline{RAM}$ of the 2-clock multi-address system, and still further, an operation as illustrated in FIG. 4 has been employed recently.

After read-out data from a selected memory cell has been obtained by sequentially making $\overline{RAS}$ and $\overline{CAS}$ low, if $\overline{RAS}$ are repeatedly made high and low while maintaining $\overline{CAS}$ at the low level, i.e., at its active or enabled state, then while the read-out data are maintained at the data output terminal, the contents of the memory cells on the word line designated by the address input can be refreshed. In other words, during the period when the read-out data is effectively revealed refresh can be effected simultaneously, and this operation is called "HIDDEN REFRESH". Heretofore, a restriction was imposed in that as shown in FIG. 4, in the HIDDEN REFRESH cycle the input WE must be maintained at the high level i.e. its inactive level, and hence this mode of operation lacks versatility as compaed to the fact that in the $\overline{RAS}$ ONLY REFRESH shown in FIG. 3 no restriction is imposed upon the input $\overline{WE}$.

Figure 5:
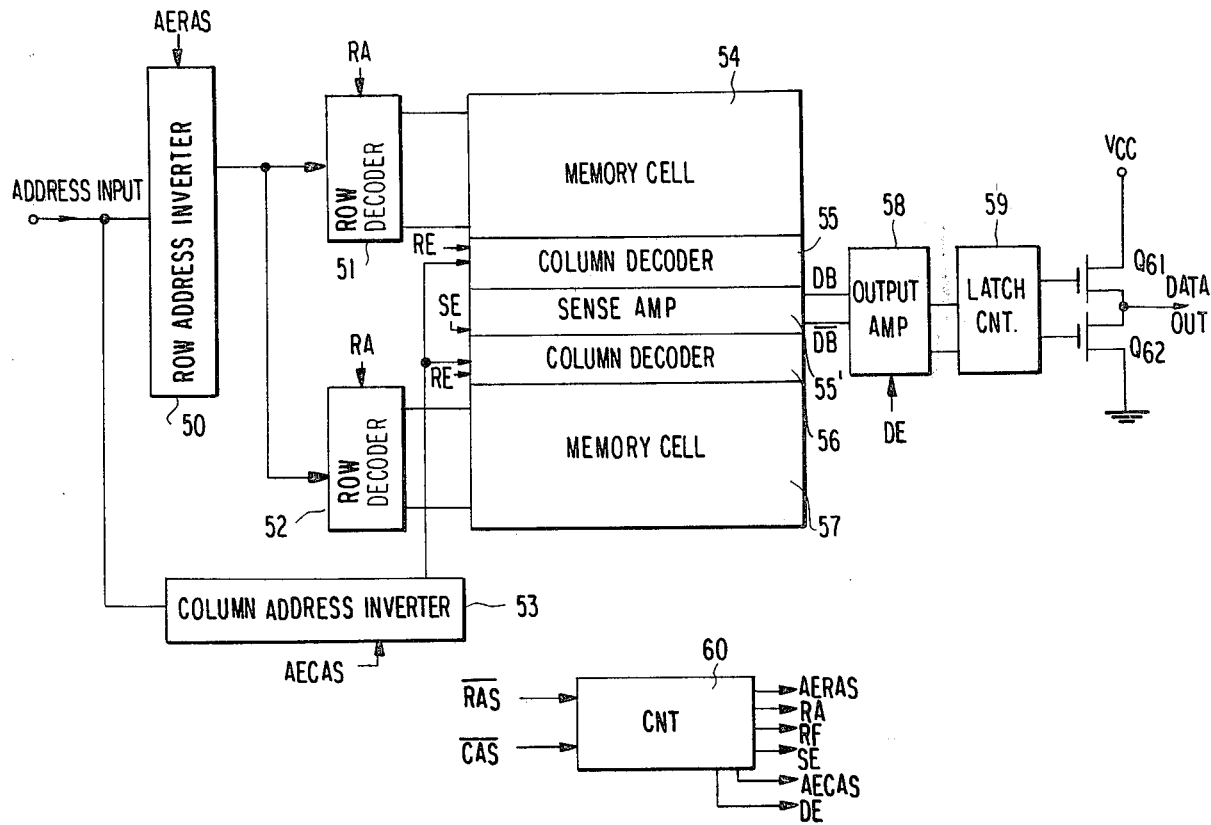
FIG. 5 is a block diagram of a RAM according to the 2-clock system in the prior art.

Now, before making a more detailed explanation of the present invention in connection with its preferred embodiment, we will first explain a general circuit system of a RAM according to the 2-clock multi-address system in the prior art with reference to FIG. 5. The RAM shown in FIG. 5 comprises a row address inverter 50, row decoders 51 and 52, a column address inverter 53, memory cell arrays 54 and 57, column decoders 55 and 56, a sense amplifier 55', an output amplifier 58, a latch control circuit 59 and a control timing generator circuit 60 responsive to $\overline{RAS}$ and $\overline{CAS}$.

Figure 6:
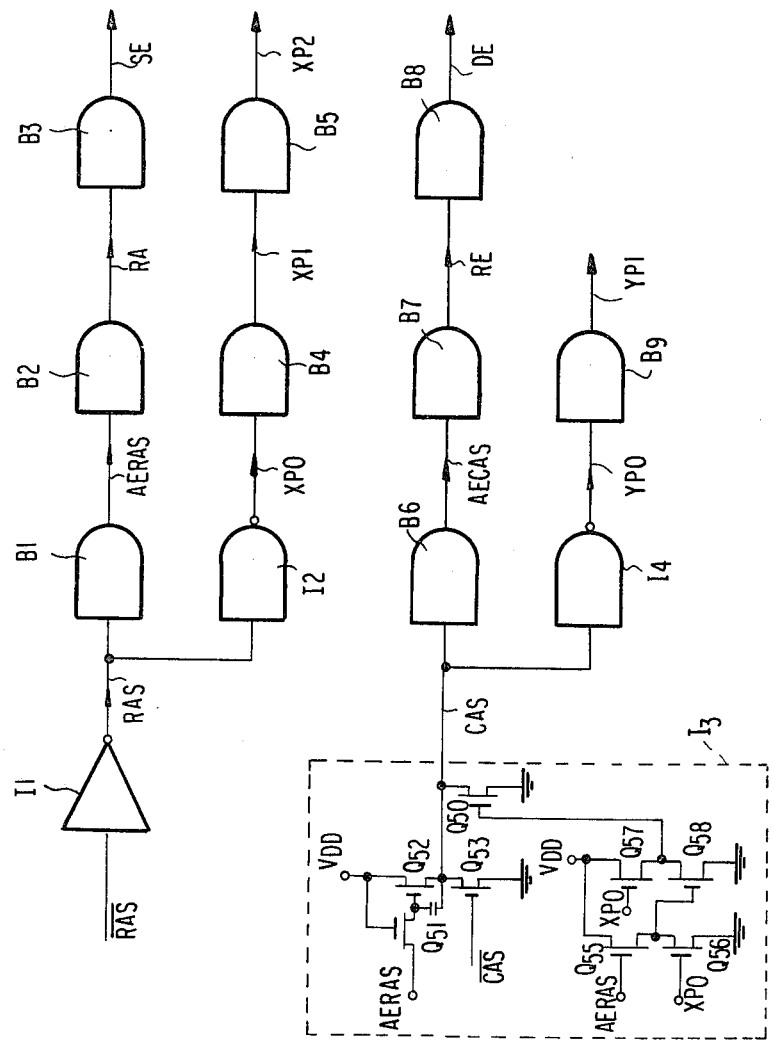
FIG. 6 is a schematic circuit diagram showing a general timing generator circuit of FIG. 5.
Figure 7:
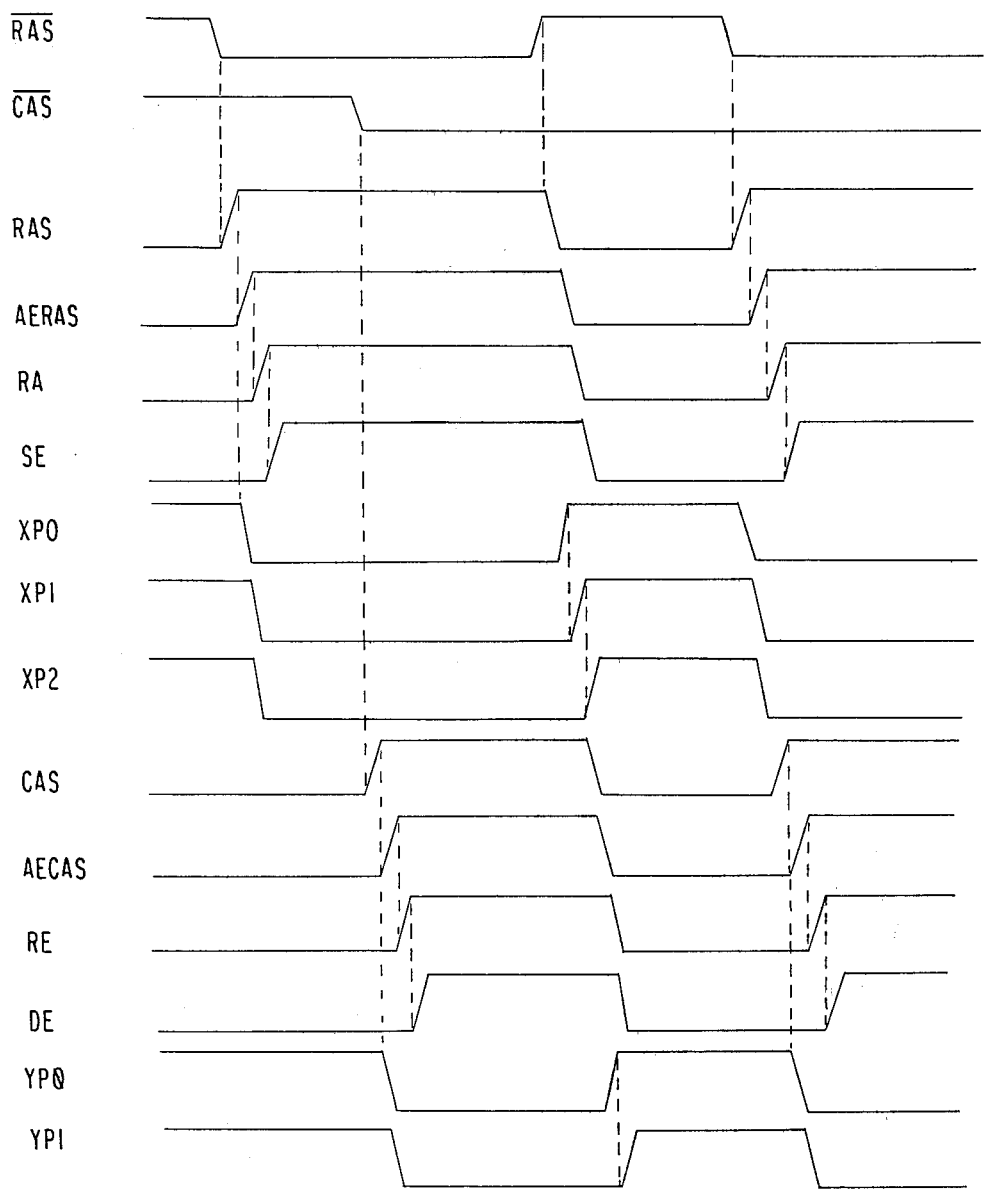
FIG. 7 is a timing waveform diagram showing timing signals appearing in FIG. 5.

The structure of the control timing generator circuit 60 is disclosed in FIG. 6. The respective timing signal waveforms generated via inverters $I_1$ to $I_4$ and buffers $B_1$ to $B_9$ in FIG. 6 are shown in FIG. 7. When $\overline{RAS}$ shits from the high level to the low level and thus goes into an active period, a level-inverted output $RAS$ derived from the inverter $I_1$ rises at first. In response to the rise of $\overline{RAS}$, precharge timing signals $XP_0$, $XP_1$ and $XP_2$ are successively changed to the low level. A timing signal AERAS also rises, so that the output of the row address inverter 50 can respond to the address input. After a selection/non-selection operation in the row decoders 51 and 52 has been completed, a timing signal RA rises, and hence the selected word line rises in level. In response to the signal RA, a timing signal SE rises, so that the sense amplifier 55' is enabled. Thus, the contents in the memory cells 54 and 57 on the selected word line are refreshed. The circuit operations in response to $\overline{RAS}$ have now been completed.

On the other hand, a gate of MOST $Q_{52}$ forming the load of the inverter $I_3$ to which $\overline{CAS}$ is applied, is charged in response to AERAS derived from $\overline{RAS}$. If this charging has been completed and also $\overline{CAS}$ shifts from the high level to the low level to achieve its active state, then a level-inverted output $CAS$ rises. In response to $\overline{CAS}$, precharging timing signals $YP_0$ and $YP_1$ fall in level and a timing signal AECAS rises, so that the output of the column address inverter 53 responds to the address input. After completion of a selection/non-selection operation of the column decoder 56, a timing signal RE rises and hence the digit line of the selected column is connected to a data input/output line. In response to the timing signal RE, a timing signal DE rises in level, so that the output amplifier 58 is enabled, and hence the information in the selected memory cell that has appeared on the data input/output lines DB and $\overline{DB}$ is amplified. Thus, the necessary data are provided at a data output terminal DATA OUT. This completes the circuit operations in response to $\overline{CAS}$.

Next, if only $\overline{RAS}$ is at the high level while maintaining $\overline{CAS}$ at low level, then at first RAS falls, and subsequently $XP_0$, $XP_1$ and $XP_2$ rise in level to effect reset-precharge operations in the $\overline{RAS}$ system, while AERAS, RA and SE at the low level. At this moment, in response to the rise of $XP_0$, CAS falls and subsequently $YP_0$ and $YP_1$ rise to effect reset-precharge operations in the CAS system while AECAS, RE and DE are at the low level. In other words, even if $\overline{RAS}$ is at the high level (reset state) while maintaining $\overline{CAS}$ are at the low level (active state), both the $\overline{RAS}$ system and the $\overline{CAS}$ system are subjected to reset-precharge. Then the latch control circuit 59 shown in FIG. 5 acts upon the output terminal DATA OUT, so that the read-out data are held at the output terminal DATA OUT. This latch function is provided, for example, by the output control circuit illustrated in FIG. 8.

Figure 8:
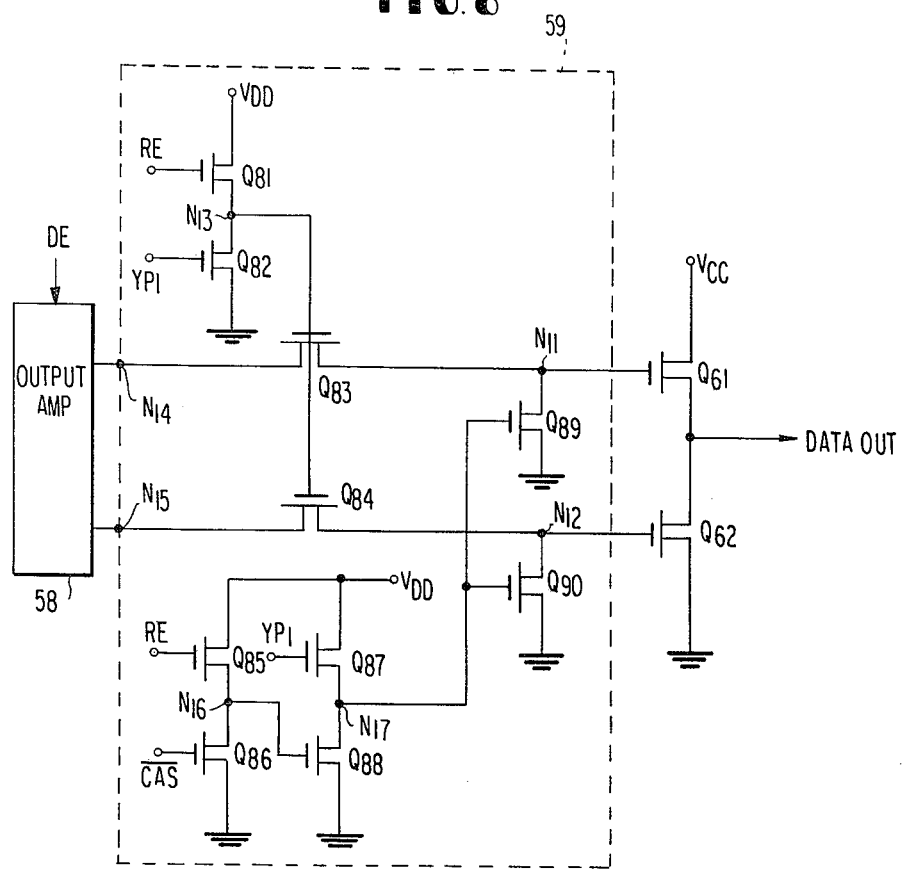
FIG. 8 is a circuit diagram of an output control circuit in the circuit shown in FIG. 6.

Referring now to FIG. 8, when the $\overline{CAS}$ system is reset, MOST $Q_{81}$ becomes a non-conducting and MOST $Q_{82}$ becomes conducting, so that a junction point $N_{13}$ shifts to ground potential and hence MOSTs $Q_{83}$ and $Q_{84}$ become non-conducting. Junction points $N_{11}$ and $N_{12}$ remain at a read-out information level, which is dynamically maintained by their capacitance, and junction points $N_{14}$ and $N_{15}$ are reset to the ground potential on the side of the output amplifier 58. MOSTs $Q_{85}$ to $Q_{90}$ form a control circuit for maintaining the output terminal DATA OUT at a high impedance when $\overline{CAS}$ is at the high level. In this case, $\overline{CAS}$ is held at the low level and MOST $Q_{86}$ is non-conducting. Hence a junction point $N_{16}$ stores an electric charge passed through MOST $Q_{85}$ in response to the high level of RE, and thus the junction point $N_{16}$ is held at the high level. MOST $Q_{88}$ is chosen to have a sufficiently large current capacity with respect to MOST $Q_{87}$ so that a junction point $N_{17}$ may be held at the low level, and MOST $Q_{89}$ and MOST $Q_{90}$ are non-conducting, resulting in no influence upon the levels at the junction points $N_{11}$ and $N_{12}$. By the above description, it has been explained that the read-out data can be maintained at the output terminal DATA OUT. Now, when $\overline{RAS}$ shifts to the low or active level while $\overline{CAS}$ is kept at the active level, then RAS, AERAS, RA and SE rise in succession. On the other hand when the charging of the load MOST $Q_{52}$ in the inverter $I_3$ to which $\overline{CAS}$ is applied in response to AERAS has been completed, CAS rises and subsequently AECAS and RE rise in succession, and hence the junction point $N_{13}$ in FIG. 8 rises, resulting in conducting of MOSTs $Q_{83}$ and $Q_{84}$. Thus, the junction points $N_{11}$ and $N_{14}$ and the junction points $N_{12}$ and $N_{15}$ are respectively connected to each other and both shift to ground potential. Accordingly, MOST $Q_{61}$ and MOST $Q_{62}$ become non-conducting so that the output terminal DATA OUT is held at a high impedance. When DE rises subsequently to the rise of RE, the output amplifier circuit 58 is activated, and an information in a newly selected memory cell appears at the output terminal DATA OUT. However, since the address input upon this activation is meaningless, the revealed output data cannot be used effectively. Moreover, if the $\overline{WE}$ input is lowered to its active level at this moment, the meaningless input data will be written in the memory, and therefore, the activation of $\overline{WE}$ must be inhibited. Thus, the operation is such that while the read-out data appearing in response to the active level of both $\overline{RAS}$ and $\overline{CAS}$ is maintained at the output terminal, refresh is effected by repeating the active level of $\overline{RAS}$ as shown in FIG. 4, and this operation is called HIDDEN REFRESH. However, in the presently known HIDDEN REFRESH, it is required to maintain the WE at its inactive level, resulting in the lack of versatility of timing signals.

Figure 10:
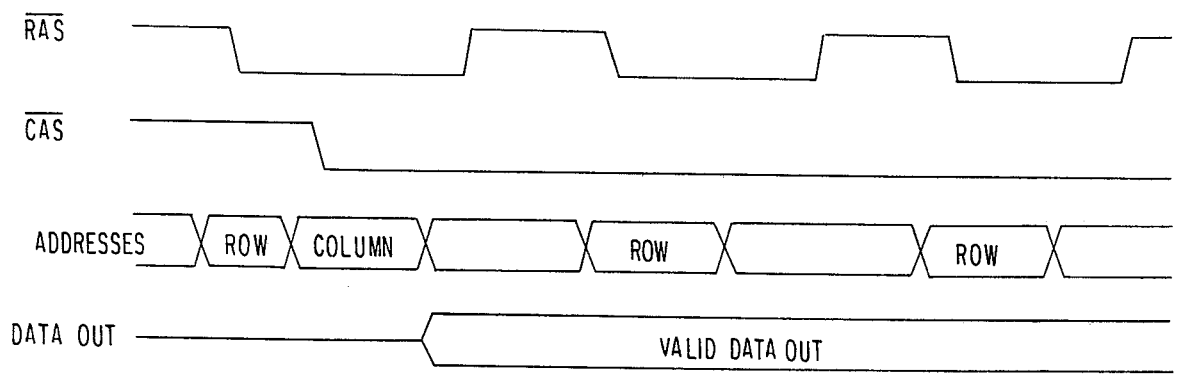
FIG. 10 is a timing diagram showing an input-output timing relationship in HIDDEN REFRESH in the circuit system according to the present invention.
Figure 9:
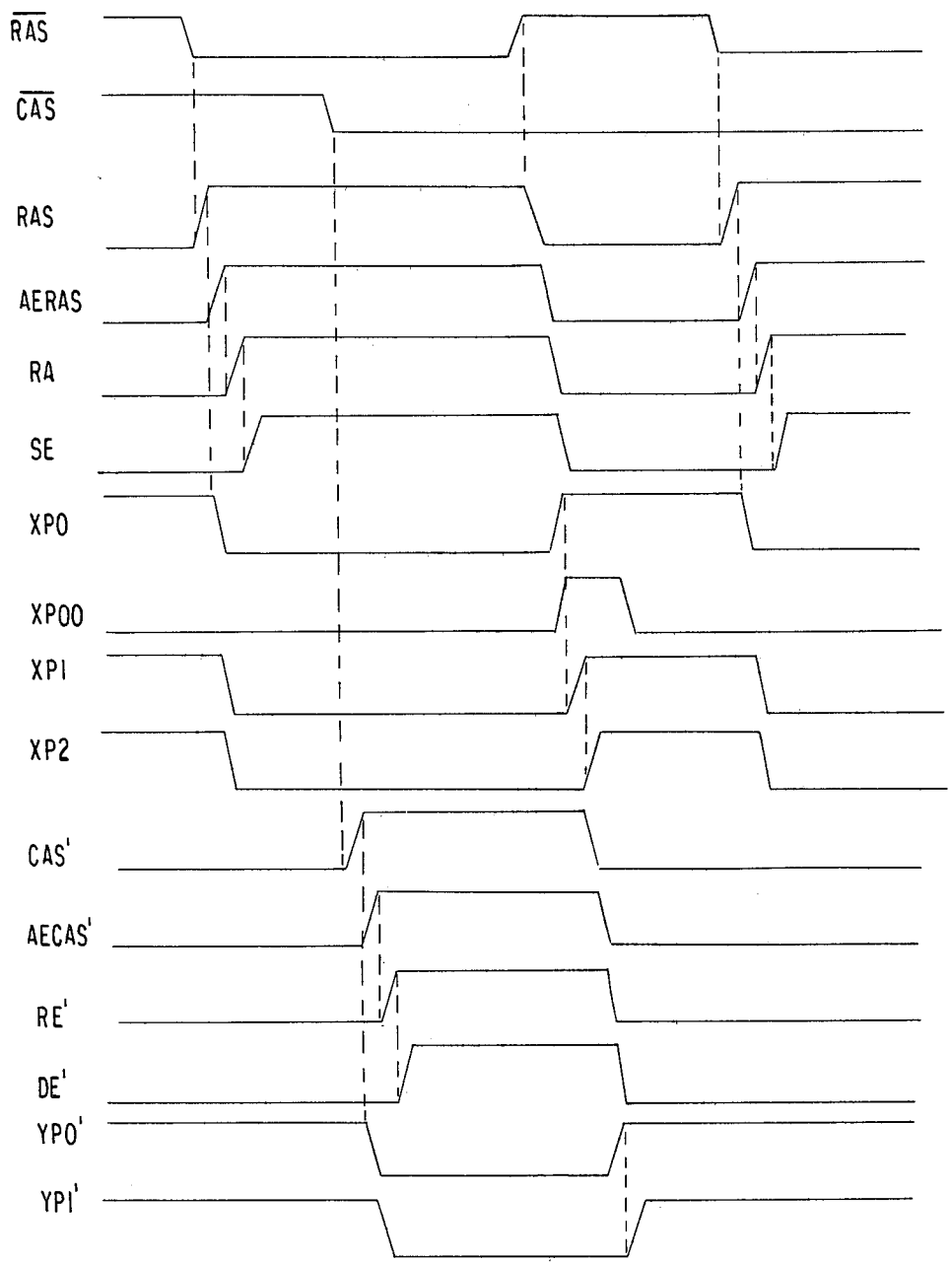
FIG. 9 is a timing waveform diagram for the circuit according to the present invention.
Figure 11:
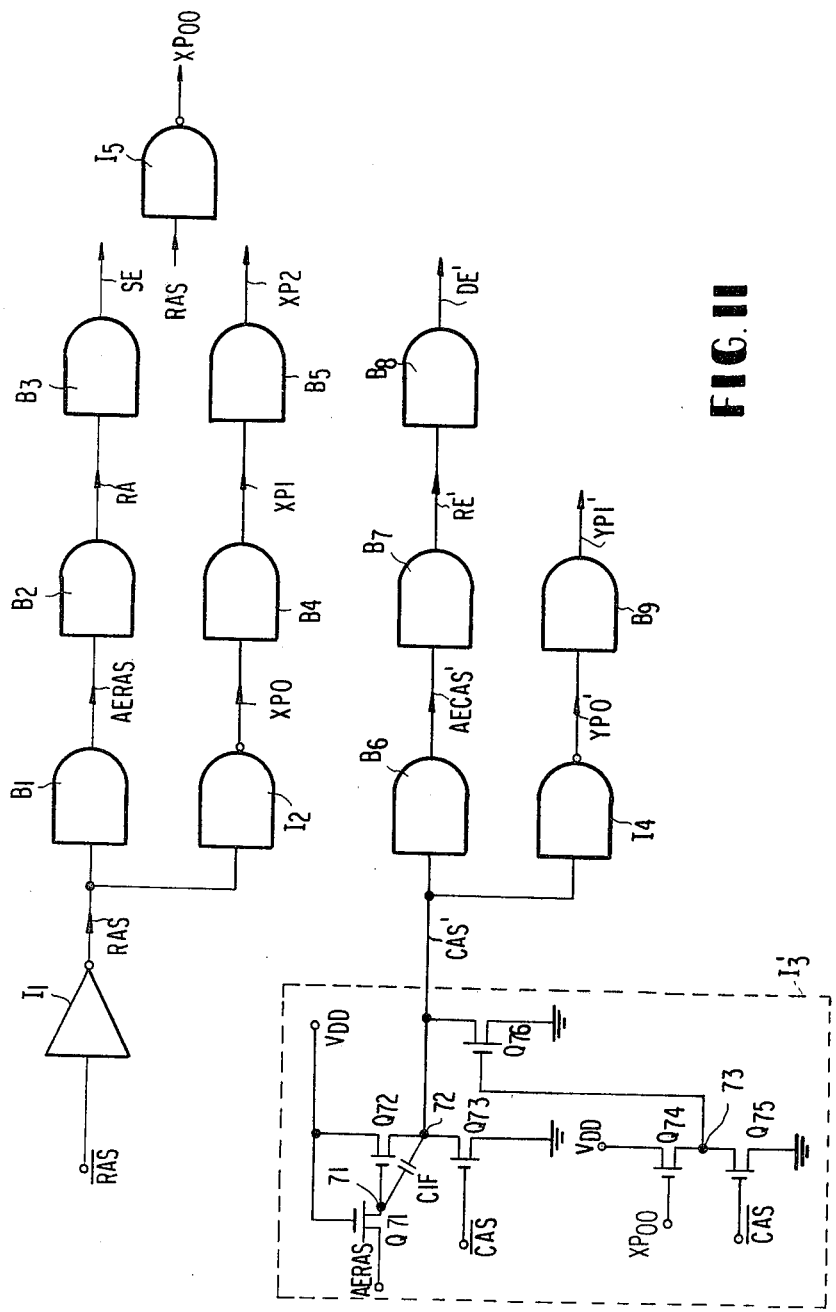
FIG. 11 is a circuit diagram of a basic circuit according to the present invention.

While the circuit system according to the present invention is similar to the prior art circuit system in that where $\overline{RAS}$ is in its reset state while maintaining $\overline{CAS}$ at its active state, both the $\overline{RAS}$ system and the $\overline{CAS}$ system are reset and precharged, the present invention is characterized in that where $\overline{RAS}$ is subsequently put at its active level while $\overline{CAS}$ is kept at its inactive level, the $\overline{RAS}$ system circuit can operate but the $\overline{CAS}$ system circuit is kept reset and does not operate. More particularly, although the timing signal CAS derived by inverting the level of $\overline{CAS}$ can be reset when $\overline{RAS}$ is reset while maintaining $\overline{CAS}$ active, upon subsequent activation of $\overline{RAS}$ the rise of the timing signal CAS is suppressed, so that the $\overline{CAS}$ system circuit does not change from the reset state at this time, and all the activation operations therein are inhibited. In this case, the digit line would not be connected to the data input/output, and moreover, since the $\overline{WE}$ series timing is normally driven by the $\overline{CAS}$ system circuit, the $\overline{WE}$ input is not involved in the circuit operation caused by the activation of $\overline{RAS}$ at all. The waveforms of the respective timing signals according to the present invention are illustrated in FIG. 9 in a similar fashion to FIG. 7. The timing signals RAS, AERAS, RA, SE, $SP_0$, $XP_1$, $XP_2$ generated in the $\overline{RAS}$ system timing generator circuit are the same as those in FIG. 7, and the $\overline{RAS}$ system timing generator circuit (see FIG. 11) is also identical to that shown in FIG. 6. However, the $\overline{CAS}$ system timing signals are modified according to the present invention, and they are represented by reference letters CAS', AECAS', RE', DE', $YD_0'$ and $YP_1'$. The $\overline{CAS}$ system timing generator circuit is accordingly modified as shown in FIG. 11. Since the restriction imposed on the $\overline{WE}$ input in the prior art system shown in FIG. 4 is eliminated, HIDDEN REFRESH in the circuit system according to the present invention is effected irrespective of $\overline{WE}$ as shown in FIG. 10. Furthermore, the circuit system according to the present invention involves an additional advantage that since the activation operations in the $\overline{CAS}$ system circuit are entirely suppressed, the power consumption upon HIDDEN REFRESH can be made as small as that upon RAS ONLY REFRESH illustrated in FIG. 3.

Figure 12:
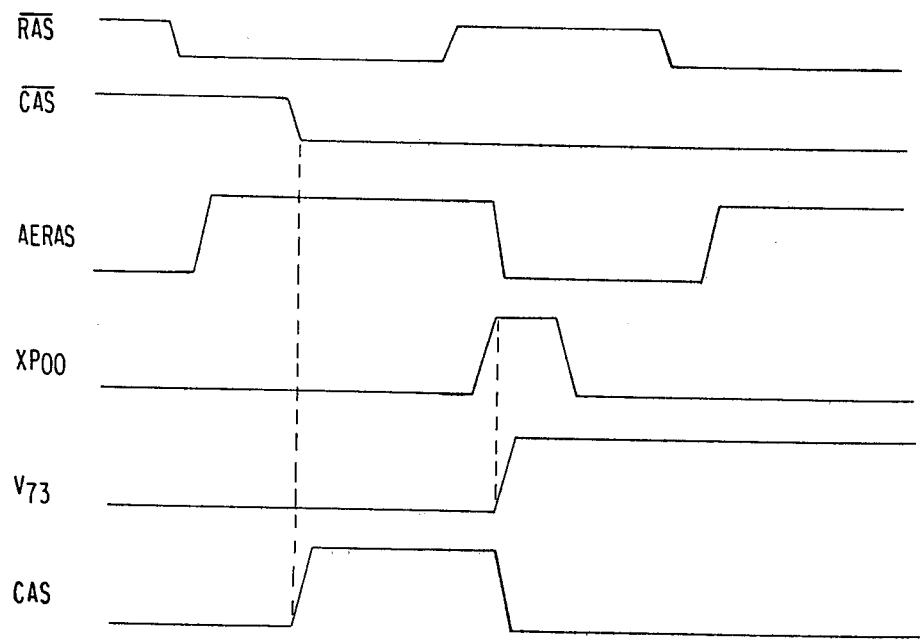
FIG. 12 is an operation waveform diagram for the circuit shown in FIG. 11.
Figure 13:
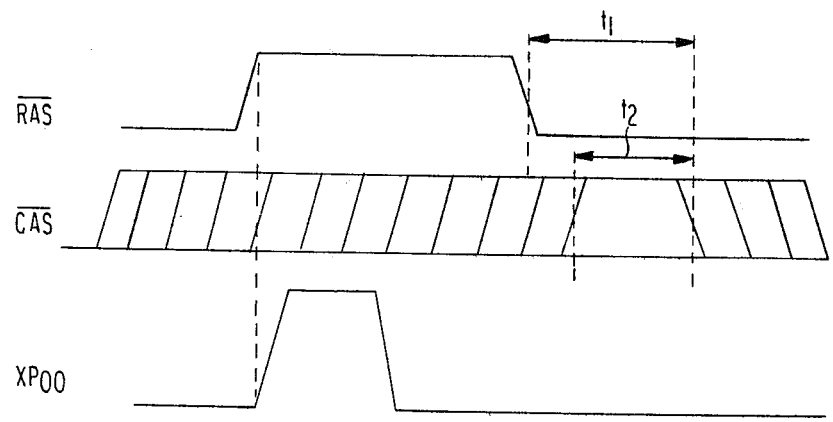
FIG. 13 is a diagram for explaining the fact that the circuit according to the present invention is effective for any combination of timings of RAS and CAS.

A description will now be made of a practical circuit for realizing the above-described circuit system according to the present invention, with references to FIG. 11 which shows a basic circuit construction of the timing generator circuit and FIG. 12 which illustrates waveforms at principal junction points. As described previously, the activation timing signal CAS' derived by level-inversion of the $\overline{CAS}$ input is normally generated by an inverter $I_3'$ including MOSTs $Q_{71}$, $Q_{72}$ and $Q_{73}$. When $\overline{RAS}$ is turned to the active (low) level and AERAS rises, a junction point 71 is charged through MOST $Q_{71}$. After a sufficient period of time, $\overline{CAS}$ is turned to the active (low) level to turn MOST $Q_{73}$ to non-conducting, and CAS' begins to rise through MOST $Q_{72}$, which is driven to an unsaturated region owing to the existence of a boot-strap capacitor C1 F, and hence CAS' reaches the $V_{DD}$ level. When the activation period of $\overline{RAS}$ terminates and it goes into a reset period, the clock $XP_{00}$ for MOST $Q_{74}$ rises immediately, and after a junction point 73 has been sufficiently charged through MOST $Q_{74}$ it shifts to the low level within the reset period of $\overline{RAS}$. Due to the rise of the junction point 73, MOST $Q_{76}$ becomes conducting and CAS' shifts to the ground potential. Assuming that $\overline{CAS}$ is maintained at the low level, MOST $Q_{75}$ is non-conducting, so that the junction point 73 is held at the high level, and after $XP_{00}$ becomes low, the junction point 73 is maintained at the high level by a capacitance at the junction point 73. Subsequently, when $\overline{RAS}$ is made at its active (low) level again while $\overline{CAS}$ is kept at the low level, the timing signal AERAS rises and thereby the junction point 71 is charged. However, if the current capacity of MOST $Q_{76}$ is chosen sufficiently large with respect to that of MOST $Q_{72}$, then CAS' cannot rise because the junction point 73 is kept at the high level. In other words, the requirement that the activation operations in the $\overline{CAS}$ system circuit should be all suppressed, can be fulfilled. In place of the timing $XP_{00}$, $XP_0$ may similarly be used. Under the timing condition of $\overline{RAS}$ and $\overline{CAS}$ in the HIDDEN REFRESH mode, the circuit of MOSTs $Q_{74}$ to $Q_{76}$ can realize the timing condition in FIG. 9 and the operation mode illustrated in FIG. 10, and it can be proved by reference to FIG. 13 that this circuit does not affect any other timing condition of $\overline{CAS}$ during the period from the reset of $\overline{RAS}$ to the next activation of same. Other timing conditions of $\overline{CAS}$ are limited only to the case a where $\overline{CAS}$ is reset, and in this case normally rated limitation to the minimum value is imposed upon time periods $t_1$ and $t_2$ shown in FIG. 13. As will be seen from this, the period when CAS is held at the high level after the shift of $XP_{00}$ to the low level, can be assured at least for the time $t_2$. In the circuit shown in FIG. 11, after $XP_{00}$ has shifted to the low level, MOST $Q_{74}$ is non-conducting, and the junction point 73 is maintained at the high level in a dynamic fashion. But when $\overline{CAS}$ shifts to the high level and MOST $Q_{75}$ becomes conducting, the junction point 73 is immediately discharged and shifts to ground potential. When MOST $Q_{76}$ becomes non-conducting as a result of the above, the circuit can respond to the next activation of the $\overline{CAS}$ series circuit without affecting CAS. The time $t_2$ necessary for discharging of the junction point 73 is normally assured.

Figure 14:
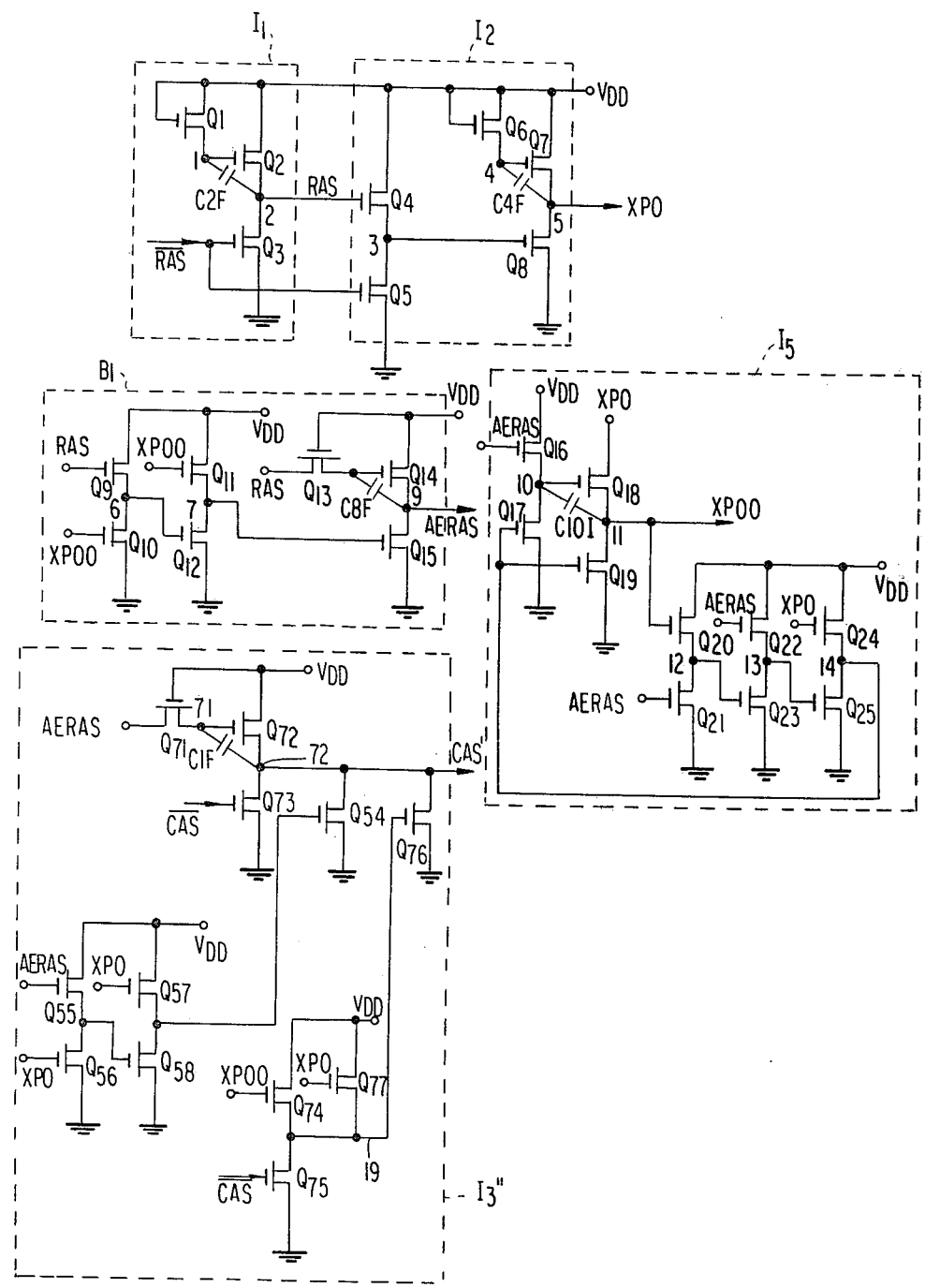
FIG. 14 is a circuit diagram showing a practical circuit embodying the present invention.
Figure 15:
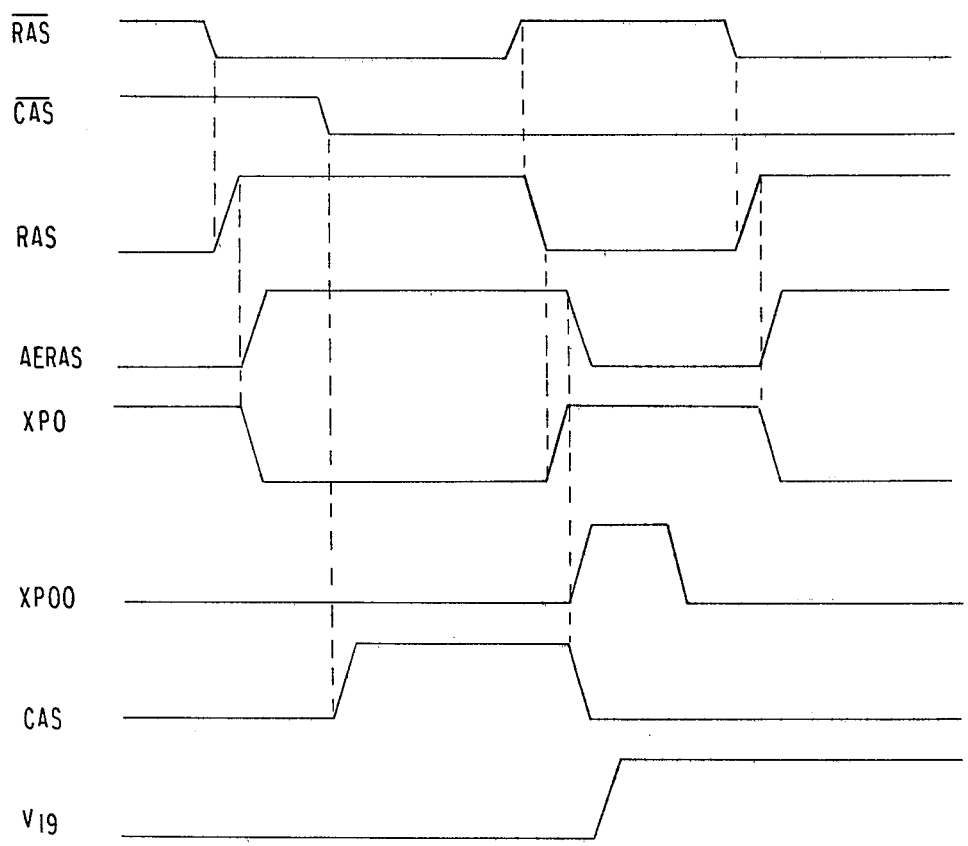
FIG. 15 is an operation waveform diagram for the circuit shown in FIG. 14.

While the operation of the basic timing circuit according to the present invention illustrated in FIG. 11 has been described above, now a practical circuit structure of one preferred embodiment of the present invention will be explained with reference to a circuit diagram shown in FIG. 14 in which major parts of the control timing generator circuits are shown, and to a waveform diagram showing operations waveforms at principal junction points in the circuit as illustrated in FIG. 15. In the circuit shown in FIG. 14, the circuit according to the present invention is applied to the inverter $I_{11}$ to which CAS is an input, and a necessary RAS system timing signal generator circuit is added to the circuit. The inverter $I_3''$ corresponds to the inverter $I_3'$ of FIG. 11, and other circuit blocks denoted as $I_1$, $I_5$ and $B_1$ correspond to ones denoted by the references in FIG. 11. The output circuit has a construction as shown in FIG. 8 such that in the read cycle, after completion of an access operation, effective data can be maintained at the output terminal so long as $\overline{CAS}$ is not reset. Starting from the state where both $\overline{RAS}$ and $\overline{CAS}$ are reset, if $\overline{RAS}$ is first put at the active level, then RAS rises up to the $V_{DD}$ level via MOST $Q_2$ owing to the boot-strap capacitor CIF. In response to RAS, a junction point 3 rises up to the level of ($V_{DD}$-threshold voltage), and so, by selecting a current capacity of MOST $Q_8$ sufficiently large with respect to that of MOST $Q_7$, $XP_0$ is shifted from the $V_{DD}$ level to the low level. On the other hand, in response to RAS, a timing signal AERAS rises up to the $V_{DD}$ level, and thereafter activation operations in the RAS series circuit are carried out. In response to the rise of AERAS, a junction point 15 is raised via MOST $Q_{26}$ up to the level of ($V_{DD}$-threshold voltage), and after waiting for the later one of $\overline{CAS}$ being activated and a junction point 18, which is an output of a delay circuit responsive to AERAS, shifting to ground potential, that is after MOSTs $Q_{73}$ and $Q_{54}$ both have become non-conducting, CAS rises. Then CAS reaches the $V_{DD}$ level via MOST $Q_{72}$ owing to a boot-strap capacitor C1 F. In response to CAS, activation operations in the $\overline{CAS}$ system circuit are effected, and assuming that the cycle under consideration is a read cycle, effective data appear at the output terminal. Under such a condition, when $\overline{RAS}$ is reset while maintaining $\overline{CAS}$ activated, RAS shifts to the low level and subsequently the junction point 3 shifts to ground potantial. MOST $Q_8$ becomes non-conducting, hence $XP_0$ rises via MOST $Q_7$ and reaches the $V_{DD}$ level owing to a boot-strap capacitor C4F. In response to the rise of $XP_0$, $XP_{00}$ rises via MOST $Q_{18}$, showing a waveform synchronized with $XP_0$, and also reaches the $V_{DD}$ level owing to a boot-strap capacitor C10F. In response to $XP_{00}$, a circuit consisting of MOSTs $Q_{20}$ to $Q_{25}$ operates, and as a result, when a junction point 14 rises, MOSTs $Q_{17}$ and $Q_{19}$ becomes conducting, resulting in a shift of $XP_{00}$ to ground potential. In other words $XP_{00}$ is held at the high level equal to $V_{DD}$ during the operation period of the circuitry of MOSTs $Q_{20}$ to $Q_{25}$. During this period, a junction point 19 is charged via MOST $Q_{35}$ up to the level of ($V_{DD}$-threshold voltage). The voltage at the junction point 19 is indicated as $V_{19}$ in FIG. 15. If only MOST $Q_{74}$ were to be used, after $XP_{00}$ has shifted to the ground potential the junction point 19 would take the high level theat is dynamically maintained, and if the period of this condition is long, there is a risk that the level may be attenuated. Therefore, as a back-up, MOST $Q_{37}$ having a small current capacity and having $XP_0$ applied to its gate, is added between the $V_{DD}$ power source and the junction point 19. Since $\overline{CAS}$ is not reset, effective data are in themselves maintained at the output terminal. Thereafter, if $\overline{RAS}$ is made active level while also keeping $\overline{CAS}$ at the active level, then activation operations in the $\overline{RAS}$ system circuit are effected in a similar manner to the above, and thereby the contents in the memory cells on the word line corresponding to the designated row address at the address input can be refreshed. In responce to the rise of AERAS, a junction point 15 rises up to the level of ($V_{DD}$-threshold voltage). However, since the junction point 19 is also maintained at the level of ($V_{DD}$-threshold voltage) and since a current capacity of MOST $Q_{76}$ is sufficiently larger than that of MOST $Q_{72}$, CAS' cannot rise but is held at the low level. Accordingly, the activation operations in the $\overline{CAS}$ system circuit are all inhibited, and only refresh operations in response to the RAS input can be effected. So long as the $\overline{CAS}$ input is held at the low level, effective data can be maintained in themselves at the output terminal, and even if reset and activation of the $\overline{RAS}$ input are repeated, the circuit other than the $\overline{RAS}$ system circuit is held in a reset condition without operating at all, and thus refresh is effected in succession. As a result, HIDDEN REFRESH illustrated in FIG. 10 can be realized.

As described above, according to the present invention there is provided a system characterized by the function that after necessary operations for a selected memory cell have been completed by sequentially making $\overline{RAS}$ and $\overline{CAS}$ at their at active levels, $\overline{RAS}$ is reset while $\overline{CAS}$ is kept at its active level, and after a necessary reset period, when $\overline{RAS}$ is again made active, all the activation operations responsive to $\overline{CAS}$ are inhibited, whereby the state at the time point when said necessary operations were completed can be in itself maintained at the data output terminal. Furthermore, according to the present invention, the aforementioned function can be realized by adding to an inverter for generating CAS a circuit comprising a first MOST ($Q_{76}$ in FIG. 11) having its drain connected to a level-inversion output CAS for the $\overline{CAS}$ input, its gate connected to a first junction point (73 in FIG. 11) and its source connected to the ground potential, a second MOST ($Q_{74}$ in FIG. 11) having its drain connected to a power supply terminal ($V_{DD}$ in FIG. 11), its gate connected to a one-shot precharge clock ($XP_{00}$ in FIG. 11) from the $\overline{RAS}$ system circuit and its source connected to the first junction point, and a third MOST ($Q_{75}$ in FIG. 11) having its drain connected to the first junction point, its gate connected to the CAS input and its source connected to ground potantial.

Since many changes could be made in the above circuit arrangement and many apparently widely different embodiments of this invention could be made without departing the scope thereof, it is intended that all matter contained in the above description or shown in the accompanying drawings shall be interpreted as illustrated and not as a limitation to the scope of the invention.

I claim:

1. A memory device comprising a plurality of word lines, a plurality of digit lines, a plurality of memory cells, input means for receiving an address signal, means for receiving a row strobe signal, means for receiving a column strobe signal, means for incorporating row address information through said input means in response to the presence of said row strobe signal, means for incorporating column address information through said input means in response to the presence of said column address strobe signal, word control means for selectively controlling said word lines based on the incorporated row address information, digit control means for selectively deriving logic information from said digit lines based on the incorporated column address information, timing means for generating a control signal for enabling said digit control means, said timing means setting said control signal in response to the presence of said column address strobe signal following the presence of said row address strobe signal and resetting said control signal in response to the absence of said row strobe signal following the presence of said column strobe signal, and suppress means for suppressing said control signal when said row strobe signal is set through its reset state within a set period of said column strobe signal.

2. The memory device according to claim 1 in which said timing means includes a first junction point, a first precharge circuit for operatively precharging said first junction point within the set period of said row strobe signal and a first discharge circuit for operatively discharging electric charge stored at said first junction point in response to the reset of said column strobe signal.

3. The memory device according to claim 2, in which said suppress means includes a second junction point, a second precharge circuit for operatively precharging said second junction point within the reset period of said row strobe signal, a second discharge circuit for operatively discharging electric charge at said second junction point in response to the reset of said column strobe signal, and a third discharge circuit operatively discharging the electric charge at said first junction point in response to the electric charge at said second junction point.

4. The memory device according to claim 2, further comprising means for generating a one shot timing signal for controlling said second precharge circuit, in which said one shot timing signal takes an its active level in response to a transient from the set to the reset of said row strobe signal and changes to its inactive level after a predetermined period from said transient within the period of said reset of said row strobe signal.

5. In a dynamic random access memory including row strobe input means for receiving a row strobe signal, column strobe input means for receiving a column strobe signal, a memory matrix arranged in rows and columns, first control means for selecting rows of said memory matrix controlled by said row strobe signal, timing means responsive to said column strobe for producing a column timing signal from a first junction point and second control means responsive to said column timing signal for controlling columns of said memory matrix, the improvement comprising a second junction point, precharge means for operatively precharging said second junction point within a period of inactive level of said row strobe signal, first discharge means responsive to an inactive level of said column strobe signal for operatively discharging electric charge at said second junction point and second discharge means responsive to electric charge at said second junction point for discharging electric charge at said first junction point.

* * * * *

UNITED STATES PATENT AND TRADEMARK OFFICE
CERTIFICATE OF CORRECTION

PATENT NO. : 4,322,825
DATED : March 30, 1982
INVENTOR(S) : Akira NAGAMI

It is certified that error appears in the above—identified patent and that said Letters Patent is hereby corrected as shown below:

Column 1, line 53, correct spelling of "maintaining";

Column 2, line 34, before "gate" insert -- its --;

Column 3, line 58, change "$\overline{\text{RAM}}$" to -- RAM --;

Column 4, line 5, change "WE" to -- $\overline{\text{WE}}$ --;

Column 4, line 8, change "paed" to -- pared --;

Column 4, line 25, change "shits" to -- shifts --;

Column 5, line 63, change "WE" to -- $\overline{\text{WE}}$ --;

Column 6, line 13, after "output" insert -- line --;

Column 6, line 38, change "RAS" to -- $\overline{\text{RAS}}$ --;

UNITED STATES PATENT AND TRADEMARK OFFICE
CERTIFICATE OF CORRECTION

PATENT NO. : 4,322,825
DATED : March 30, 1982
INVENTOR(S) : Akira NAGAMI

It is certified that error appears in the above—identified patent and that said Letters Patent is hereby corrected as shown below:

Column 7, line 18, after "case" delete "a";

Column 7, line 19, after "case" insert -- a --;

Column 7, line 50, after "the" insert -- same --;

Column 8, line 30, change "theat" to -- that --;

Column 8, line 43, change "responce" to -- response --;

Column 8, line 64, before "active" cancel "at";

Column 9, line 17, change "potantial" to -- potential --;

Column 9, line 24, change "trated" to -- trative --.

Signed and Sealed this

Twenty-ninth Day of June 1982

[SEAL]

Attest:

GERALD J. MOSSINGHOFF

Attesting Officer  Commissioner of Patents and Trademarks